United States Patent
Spenea et al.

(10) Patent No.: US 6,882,214 B2
(45) Date of Patent: Apr. 19, 2005

(54) CIRCUIT AND METHOD FOR TRIMMING LOCKING OF INTEGRATED CIRCUITS

(75) Inventors: Marian Udrea Spenea, San Jose, CA (US); Constantin Bucur, Santa Clara, CA (US); Marian Niculae, San Jose, CA (US); George Simion, San Jose, CA (US); Viorel Marinescu, San Jose, CA (US)

(73) Assignee: O2Micro International Limited, Grand Cayman (KY)

( * ) Notice: Subject to any disclaimer, the term of this patent is extended or adjusted under 35 U.S.C. 154(b) by 7 days.

(21) Appl. No.: 10/624,295

(22) Filed: Jul. 22, 2003

(65) Prior Publication Data

US 2004/0227215 A1 Nov. 18, 2004

Related U.S. Application Data

(60) Provisional application No. 60/471,205, filed on May 16, 2003.

(51) Int. Cl.[7] .................................................. H01H 85/00
(52) U.S. Cl. ..................... 327/525; 327/526; 365/225.7
(58) Field of Search ................................ 327/525, 526; 365/225.7

(56) References Cited

U.S. PATENT DOCUMENTS

| | | | |
|---|---|---|---|
| 4,412,241 A | * 10/1983 | Nelson | 257/529 |
| 5,079,516 A | 1/1992 | Russell et al. | 330/261 |
| 6,338,032 B1 | 1/2002 | Chen | 703/16 |
| 6,410,398 B1 | 6/2002 | Forel et al. | 438/382 |
| 6,472,897 B1 | 10/2002 | Shyr et al. | 324/765 |

OTHER PUBLICATIONS

S. Laville, S. Pontarollo, "Integrated Offset Trimming Technique", ST Microelectronics DSG, and D. Dufaza, D. Auvergne, LIRMM (date unknown).

* cited by examiner

*Primary Examiner*—Kenneth B. Wells
(74) *Attorney, Agent, or Firm*—Grossman, Tucker, Perreault & Pfleger, PLLC

(57) ABSTRACT

A trimming locking circuit is provided for IC using a programmable fuse array for after-assembly trimming procedures. In one embodiment, a trimming locking circuit is provided for a single power supply input into the programmable fuse array. In another embodiment, a trimming locking circuit is provided to operate with two or more power supply inputs. The trimming locking circuit electrically isolates the programmable fuse array from over voltage conditions on the power supplies.

5 Claims, 5 Drawing Sheets

EMBEDDED IC TRIMMING LOCKING SCHEMATIC
TWO POWER SUPPLIES IC

EMBEDDED IC TRIMMING SCHEMATIC

EMBEDDED IC TRIMMING SCHEMATIC

EMBEDDED IC TRIMMING LOCKING SCHEMATIC
TWO POWER SUPPLIES IC

EMBEDDED IC TRIMMING LOCKING SCHEMATIC
ONE VOLTAGE SUPPLY IC

PROGAMABLE FUSE ARRAY
ONE CELL ONLY IS SHOWN

CIRCUIT AND METHOD FOR TRIMMING LOCKING OF INTEGRATED CIRCUITS

The present application claims the benefit of U.S. Provisional Application Ser. No. 60/471,205, filed May 16, 2003.

FIELD OF THE INVENTION

The present invention relates to integrated circuits using after-assembly trimming procedure, and more particularly, to power management integrated controllers using after-assembly trimming procedure.

BACKGROUND OF THE INVENTION

Conventional post-assembly IC trimming procedures generally end with a locking step, designed to disconnect the trimming block from the package pins, making these pins available for other functions, and disable permanently the trimming block, while preserving the trimmed parameter values status. The post-assembly trimming procedure results in an IC with stable parameters, which cannot be further modified through accidentally trimming. Conventional IC trimming circuitry is described in FIG. 1 and FIG. 2. FIG. 1 shows an IC with a single voltage supply PIN A (VCC) 5, while FIG. 2 shows an IC with two voltage supplies, PIN A (VCC) 5, AND PIN B (LVCC) 6. The energy necessary to change the fuse status is supplied by VCC_Trimming node 8, which is connected either to PIN A 5 or PIN B 6. The programmable fuse (or Zener diodes) array 2 is addressed by the input trimming data 9. This input data includes conventional data to address programmable fuses (or Zener diodes). The output of each individual fuse can be obtained from the fuse status outputs 10 of the programmable fuse array block 2. Each fuse cell 4 typically includes a fuse (or Zener diode), a means to change the fuse status (typically a switch controlled by the input trimming data 9), and a sensing block (not shown) that provides the fuse status output 10.

Conventional techniques for trimming locking is provided in, for example, U.S. Pat. No. 5,079,516 Russell, et al., U.S. Pat. No. 6,472,897 Shyr, et al., and U.S. Pat. No. 6,338,032 Chen. As a general matter, these patents operate by inhibiting the input trimming data transmission from the package pins to the programmable fuse array block 2.

The switch in the fuse cell 4 can include a generic a MOS transistor or a SCR device. Once the fuse is set (blown), the switch cannot be turned on by means of the control terminal; therefore the fuse status cannot be changed once set. The major drawback of this approach is that the fuse (or Zener diode) and the controllable switch in fuse cell 4 remain connected to the package pins after the trimming procedure is completed. A subsequent abnormal voltage (over voltage, high dv/dt voltage spike, electro-static discharge (ESD) spike) on pin A 5 or on pin B 6 may parasitically turn on the switch in fuse cell 4 (for example, by a break-over, snap-back, and/or drain-gate capacitance effect), and accidentally blow out the corresponding fuse (or short-circuit the Zener diode), changing the original trimming procedure results. This means that the above locking methods are not entirely secure against possible environmental voltage conditions.

In another trimming locking approach, described in U.S. Pat. No. 5,079,516 Russell, et al., two fuses have to be blown out, for each trimmed bit. Two SCR devices are also needed for locking each trimmed bit. Thus, this method tends to be complicated and larger chip area is consumed. Moreover, this type of locking procedure based on blown out fuses tends to be only applicable for cavity containing packages, i.e., plastic packages typically cannot use this locking approach.

SUMMARY OF THE INVENTION

The goal of the present invention is to provide the integrated circuits in either plastic or cavity containing package, and using a post-assembly trimming procedure a trimming locking circuit and method that secures the trimming status against subsequent electrical events. The circuit and method of the present invention may be adapted to change the physical path for delivering the energy to the programmable fuses. Therefore, neither the normal trimming procedure, nor any electrical event that may exceed the normal operating conditions (ESD, EOS) will modify the fuse, thereby locking the trimming status. The present invention may also be used in integrated circuits encapsulated in plastic or cavity containing package. The present invention may also use the post assembly trimming pins, and therefore implementation of the present invention can be accomplished without requiring supplementary pins. The present invention may be implemented with a low component count. For example, in exemplary embodiments described herein the present invention can be implemented using three or four supplementary integrated elements only: a metal fuse, one or two diodes, and one resistor. The present invention can also be adapted to be used in conjunction with an after-assembly trimming procedure that implements poly-silicon fuses or Zener diodes to encode the trimming data.

In one exemplary embodiment, a trimming blocking circuit is provided adapted for use with a single power supply. In this embodiment, a trimming locking circuit is provided in an integrated circuit with a programmable fuse array that includes a metal fuse and a first blocking diode coupled in series to an input pin; a second blocking diode and a supply resistor coupled in parallel to a power supply; and wherein said metal fuse, said supply resistor and said blocking diodes adapted to electrically isolate a load from over voltage conditions present on said input pin.

In another exemplary embodiment, a trimming blocking circuit is provided adapted for use with a two (or more) power supplies. In this embodiment, a trimming locking circuit is provided in an integrated circuit with a programmable fuse array that includes a metal fuse and a supply resistor coupled in parallel, and coupled between a second power supply and a programmable fuse array supply line; a blocking diode coupled in reverse bias between said metal fuse and said supply resistor and a first power supply; and wherein said metal fuse, said supply resistor and said diode adapted to electrically isolate a load from over voltage conditions present on said second power supply.

It will be appreciated by those skilled in the art that although the following Detailed Description will proceed with reference being made to preferred embodiments and methods of use, the present invention is not intended to be limited to these preferred embodiments and methods of use. Rather, the present invention is of broad scope and is intended to be limited as only set forth in the accompanying claims.

Other features and advantages of the present invention will become apparent as the following Detailed Description proceeds, and upon reference to the Drawings, wherein like numerals depict like parts, and wherein:

DETAILED DESCRIPTION OF EXEMPLARY EMBODIMENTS

Figure 1:
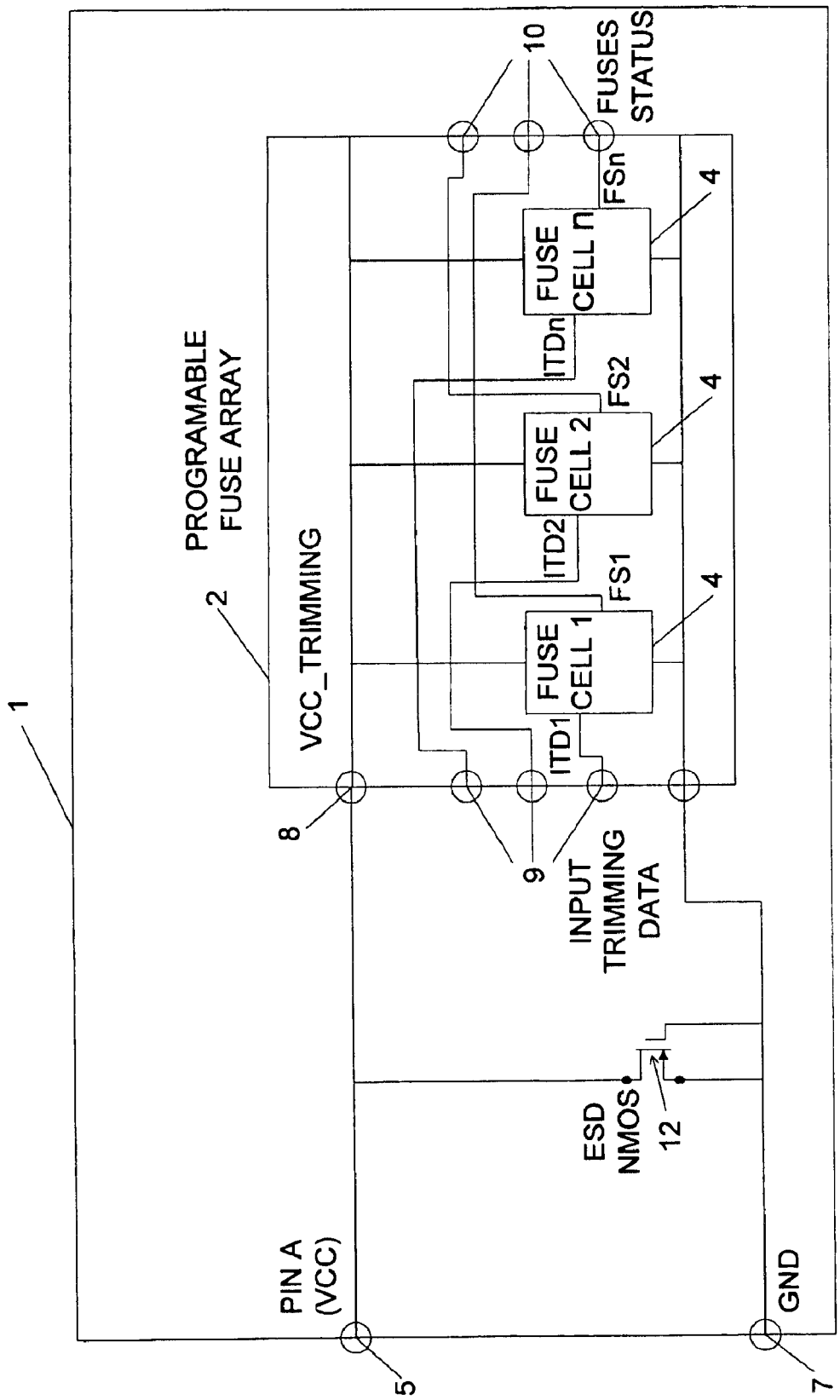
FIG. 1 is a circuit diagram of a conventional IC trimming circuit.
Figure 2:
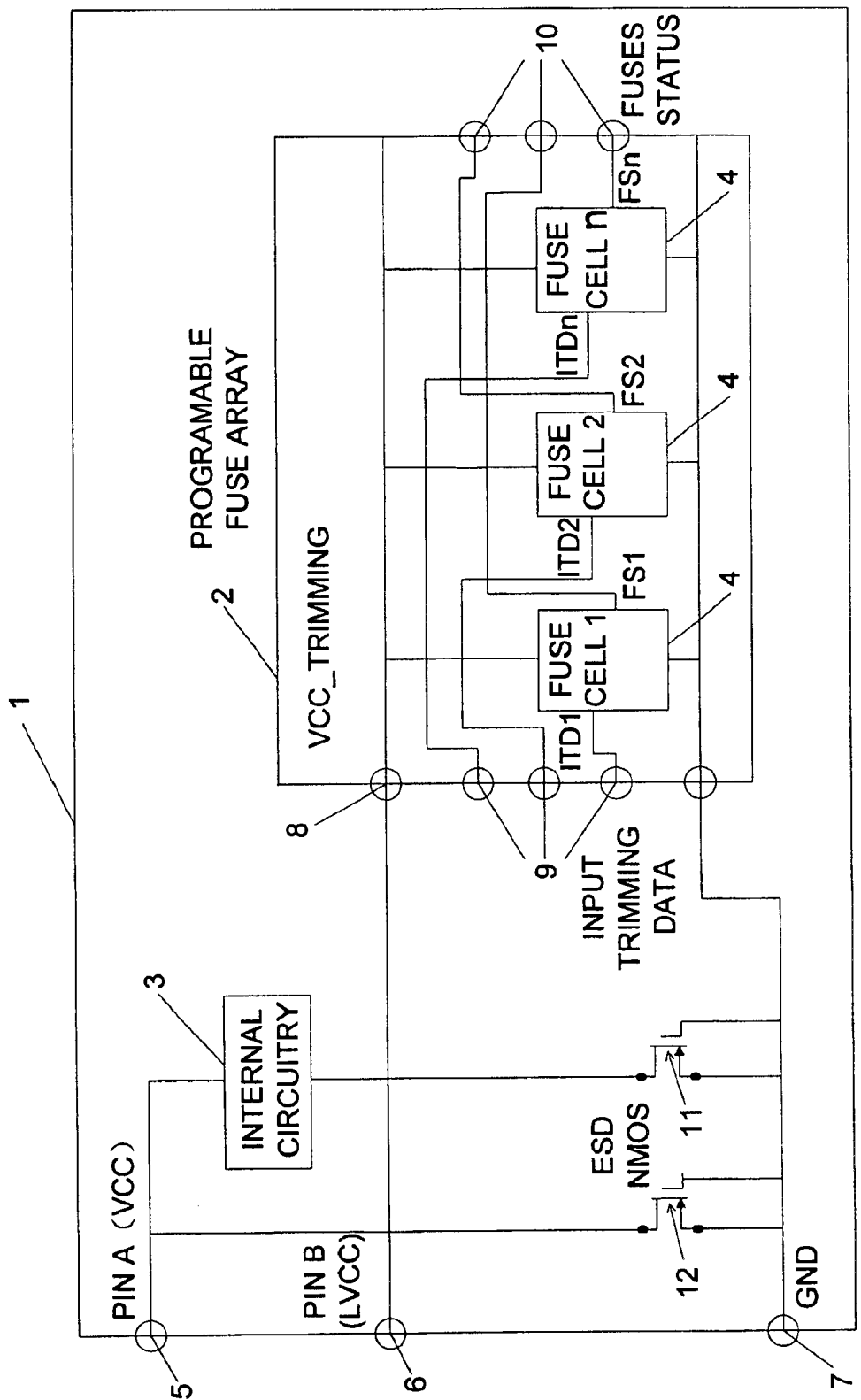
FIG. 2 is a circuit diagram of another conventional IC trimming circuit.
Figure 3:
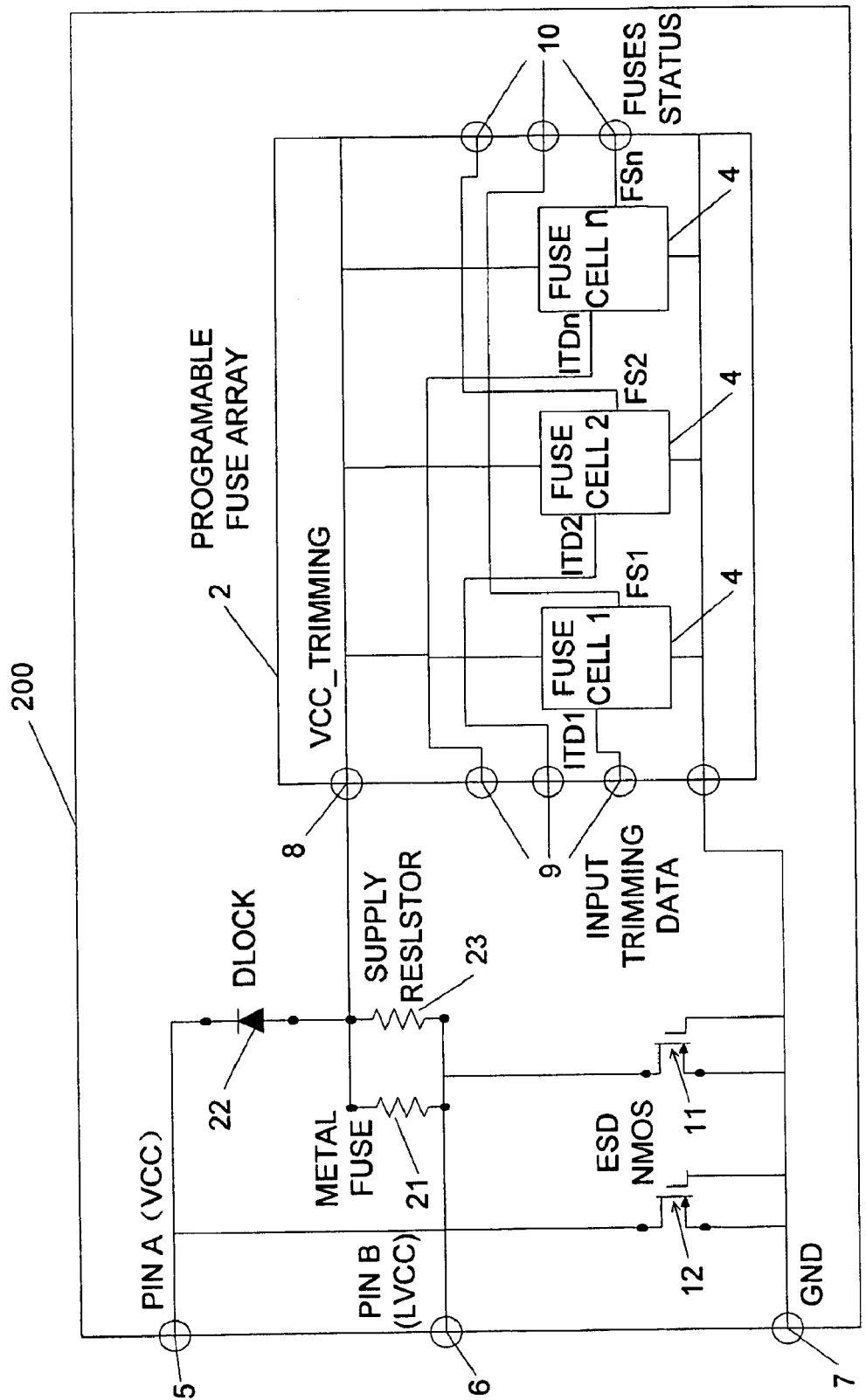
FIG. 3 is a circuit diagram of one exemplary trimming circuit according to the present invention.

The object of the present invention is described below, with reference to the FIGS. 3, 4, and 5, which represent the main blocks of exemplary embodiments of the invention. The trimming locking method and circuit is described for two IC types: one voltage supply ICs (FIGS. 4, and 5), and two or more voltage supplies ICs (FIGS. 3, and 5). Broadly stated, the present invention provides a locking trimming circuit that includes inserting a metal fuse across the power path to the programmable fuse array (poly-silicon fuses or Zener diodes). The metal fuse is selected to sustain the current needed to blow out the poly-silicon fuses or Zener diodes. The metal fuse is blown out using a circuit configuration that is also the object of the present invention. Once the metal fuse is blown out, the energy that can flow to the programmable fuse (poly-silicon fuses or Zener diodes as well) array is limited, so the possibility of a parasitic blow out of a fuse is substantially reduced. In other words, no subsequent parasitic voltage can deliver enough energy to the programmable fuse array, therefore the trimming results are safely preserved. The present invention is intended for any integrated circuit that uses a trim process to set the value of one or more voltage/current signals associated with the IC.

Figure 4:
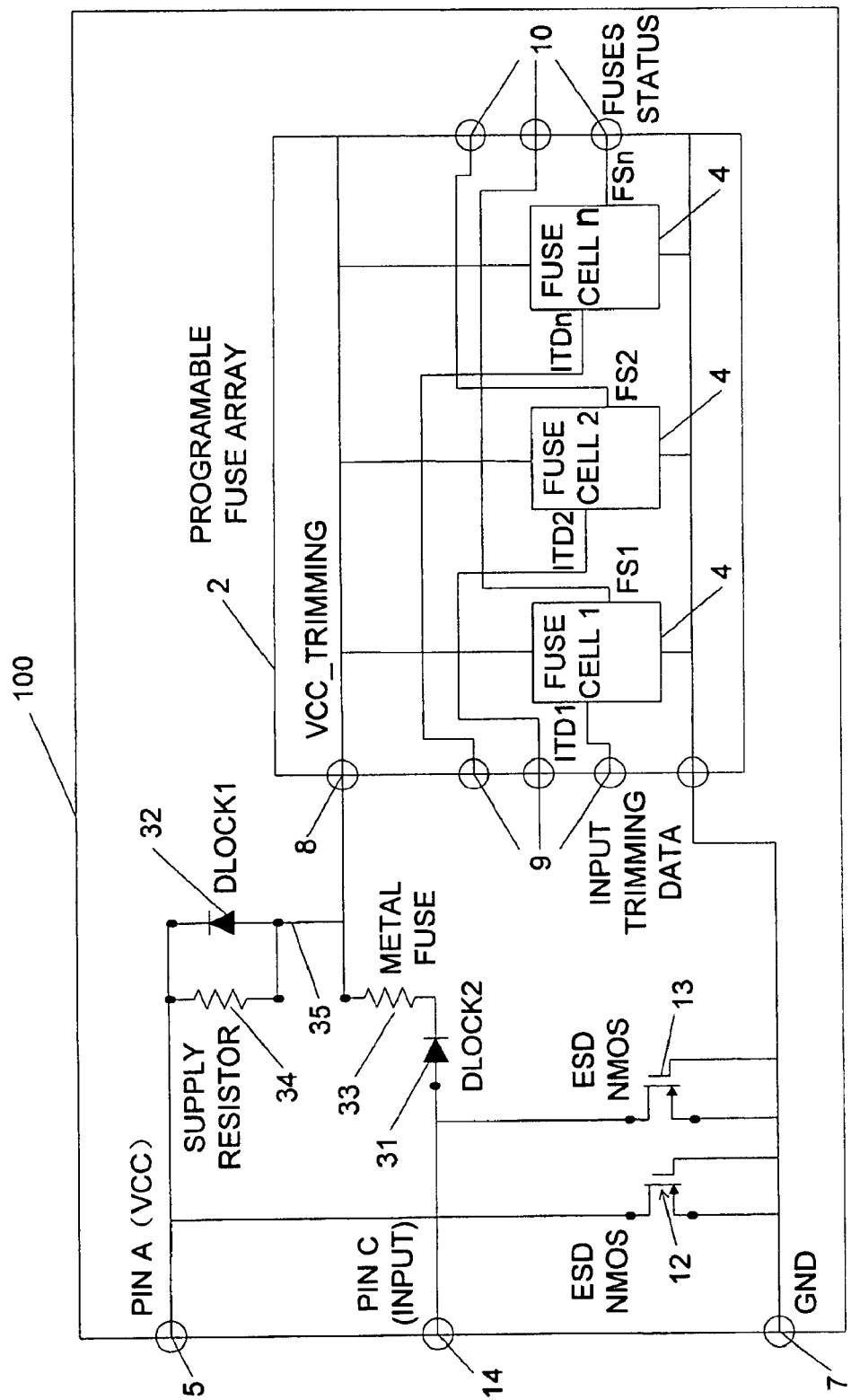
FIG. 4 is a circuit diagram of another exemplary trimming circuit according to the present invention.
Figure 5:
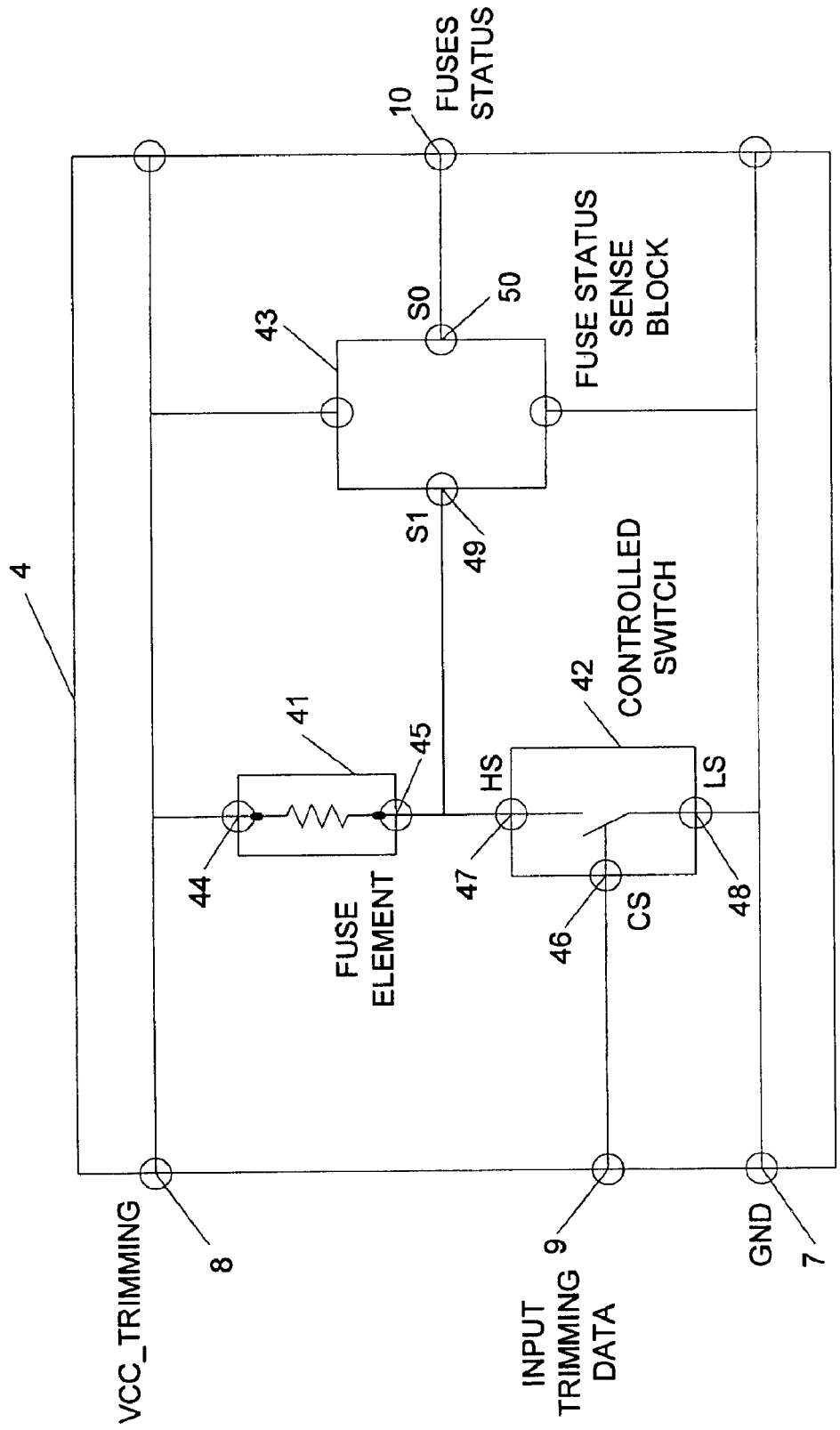
FIG. 5 is a circuit diagram of an exemplary programmable fuse array according to the present invention.

FIG. 4 depicts an exemplary trimming circuit 100 that uses one metal fuse 33, two diodes DLOCK1 32, and DLOCK2 31, and one supply resistor 34. The trimming circuit 100 of FIG. 4 is an example of a trim locking circuit according to the present invention with a single power supply. This circuit is adapted to lock the trimming process, regardless of the number of bits (fuse cells 4) that are trimmed. A detailed block diagram of an exemplary fuse cell 4 is depicted in FIG. 5.

The supply power for the programmable fuse array 2 is supplied during the post-assembly trimming process to the local supply line VCC_Trimming 8 from PIN C 14 (typically an input pin of the IC that is not involved in the trimming procedure), through the DLOCK2 diode 31 in series with the metal fuse 33. A conventional trimming process is conducted through the input trimming data signals 9, which are supplied to the switches 42 (FIG. 5) through a very high impedance path (for example, MOS gates 46). The programmable fuse array outputs signals 10, through very high impedance path (e.g., MOS gates). PIN A (VCC) 5 provides the normal IC power supply, and can be tied together with PIN C (Input) 14 during the trimming process.

Once the trimming process is complete, PIN A (VCC) 5 is connected to the ground GND 7, and the PIN C 14 voltage is raised a sufficient amount so the current necessary to blow out the metal fuse 33 can flow from PIN C 14 through DLOCK2 31, Metal fuse 33, and DLOCK1 32 to PIN A (VCC) 5. After the metal fuse 33 is blown, the local VCC-Trimming line 8 is supplied from PIN A (VCC) 5, through the supply resistor 34. The supply current for the programmable fuse array 2 is only necessary to detect the trimmed fuses status, and therefore the supply resistor 34 can be set to a large value, depending on, for example, the current requirements of the fuse array.

Over voltage on nodes PIN C 14, and PIN A 5 is limited during an ESD event by the regular ESD devices 13, and 12. Finally, after the metal fuse 33 is blown out, the programmable fuse array 2 remains only coupled to the package pins through the supply resistor 34. The resistance value of the supply resistor 34 is selected to be large enough so a parasitic over voltage (limited by the ESD device 12) on PIN A (VCC) 5 cannot transfer the necessary energy to the local supply line 8 to possibly blow out one or more trimming fuses in the fuse cell 4. This provides the after-assembly trimming locking against possible subsequent over-voltage events. The input on PIN C 14 is electrically isolated from the programmable fuse array 2 when the metal fuse 33 is blown (described above). Also, PIN C is isolated due to the blocking effect of diode DLOCK2 31. PIN C 14 can be used for the second function it was intended for (Input). After the metal fuse 33 is blown, only a limited energy can be supplied to the programmable fuse array 2, either through the supply resistor (high resistance) or through the residual resistance of the blown metal fuse (high resistance, even for plastic package).

The concept is therefore applicable to the plastic packaged ICs as well. Even if the metal fuse 33 is not blown completely, its remaining resistance will typically be large enough, and therefore energy transferred through this path during an over voltage event typically cannot affect the programmable fuses in the fuse cells 4.

Referring now to FIG. 3, another exemplary trimming circuit 200 that uses one metal fuse 21, one diode DLOCK 22, and one supply resistor 23 is depicted. The trimming circuit 200 of FIG. 3 is an example of a trim locking circuit according to the present invention with two power supplies. This circuit is adapted to lock the trimming process, regardless of the number of bits (fuse cells 4) that are trimmed. A detailed block diagram of an exemplary fuse cell 4 is depicted in FIG. 5.

The supply power for the programmable fuse array 2 during the post-assembly trimming process is supplied to the local supply line VCC_Trimming 8 from PIN B (LVCC) 6 (typically a secondary constant voltage, lower than VCC) through the metal fuse 21. The trimming process using conventional techniques (described above) supplies the Input Trimming Data signals 9 to the switches 42 in FIG. 5 through a very high impedance path (MOS gates 46). Once the trimming process is complete, PIN A (VCC) 5 is connected to the ground GND 7, and the PIN B 6 voltage is increased, so the current necessary to blow out the metal fuse 21 can flow through the metal fuse 21, and DLOCK diode 22 to PIN A (VCC) 5 pin.

After the metal fuse 33 is blown, the local VCC-Trimming line 8 is supplied from PIN B (LVCC) 6, through the supply resistor 23. The supply current for the programmable fuse array is only necessary to detect the trimmed fuse status, and accordingly, the supply resistor can be selected to an appropriate large value, depending on, for example, the current requirements of the fuse array.

Finally, after the metal fuse 23 is blown, the programmable fuse array 2 remains only coupled to the package pins through the supply resistor 23, which is selected large enough so that a parasitic over voltage (limited by the ESD device 11) on PIN B (LVCC) 6 will have no effect upon the fuses in the programmable fuse array 2.

Therefore, accidental energy transfer to the local supply line 8 (which can possibly blow out one or more trimming fuses in the fuse cell 4) is likewise prevented. PIN B 6 can be used afterwards for the main function for which it was intended (in this example PIN B is used as constant voltage supply pin). The concept is equally applicable to the plastic packaged ICs. Even if the metal fuse 21 is not completely blown open, its remaining resistance is larger than the resistance of the supply resistor 23, and the supplied energy transferred through this path during an over voltage event will not affect the programmable fuses in the fuse cells 4.

Those skilled in the art will recognize numerous modifications which may be made to the present invention. For example, the present invention describes a trimming locking circuit that is used in conjunction with a programmable fuse array 2. However, the present invention can be applied to any load, and thus, the programmable fuse array may be generalized herein as a load. Additionally, a description of a single and dual power supply topologies is provided herein, but the present invention is equally extendable to any number of power supplies.

Also, supply resistor described above with reference to FIGS. 3 and 4 is stated as having a relatively large resistance value, based on for example, the current requirements of the programmable fuse array 2. The exact resistance value of the supply resistor 34 or 23 will vary based on the operating environment, the selected application, and the desired component tolerance. Therefore, the term "large" or "relatively large" in reference to the resistance value of the supply resistor should be construed broadly to mean any selected value that will lock the programmable fuse array in accordance with the principles set forth herein. All such modifications are deemed within the spirit and scope of the present invention, only as limited by the claims.

What is claimed is:

1. A trimming locking circuit for a an integrated circuit with a programmable fuse array, comprising:

a metal fuse and a supply resistor coupled in parallel, and coupled between a second power supply and a programmable fuse array supply line;

a blocking diode coupled in reverse bias between said metal fuse and said supply resistor and a first power supply;

wherein said metal fuse, said supply resistor and said diode are adapted to electrically isolate a load from over voltage conditions present on said second power supply.

2. A trimming locking circuit as claimed in claim 1, further comprising:

a first ESD device coupled between said first power supply and ground, and a second ESD device coupled between said second power supply and said ground; said ESD devices operable to inhibit an electrostatic discharge on either said first or second power supplies.

3. A trimming locking circuit as claimed in claim 1, wherein said supply resistor has a resistance value selected to reduce said over voltage conditions present on said second power supply.

4. A trimming locking circuit as claimed in claim 1, wherein said metal fuse is selected to become an open circuit upon the application of a selected amount of current.

5. A trimming locking circuit as claimed in claim 1, wherein said metal fuse, said supply resistor and said diode are configured to perform an after assembly trim procedure using said programmable fuse array and said second power supply.

* * * * *